US011501946B2

(12) United States Patent
Cook et al.

(10) Patent No.: US 11,501,946 B2
(45) Date of Patent: Nov. 15, 2022

(54) METHOD OF INFLUENCING A CHARGED PARTICLE BEAM, MULTIPOLE DEVICE, AND CHARGED PARTICLE BEAM APPARATUS

(71) Applicant: ICT Integrated Circuit Testing Gesellschaft für Halbleiterprüftechnik mbH, Heimstetten (DE)

(72) Inventors: Benjamin John Cook, Munich (DE); Bernd Woellert, Markt Schwaben (DE); Dieter Winkler, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 17/189,013

(22) Filed: Mar. 1, 2021

(65) Prior Publication Data
US 2022/0277921 A1  Sep. 1, 2022

(51) Int. Cl.
*H01J 37/147* (2006.01)
*H01J 37/12* (2006.01)
(Continued)

(52) U.S. Cl.
CPC .......... *H01J 37/1477* (2013.01); *H01J 37/12* (2013.01); *H01J 37/153* (2013.01); *H01J 37/28* (2013.01);
(Continued)

(58) Field of Classification Search
CPC ...... H01J 37/12; H01J 37/1477; H01J 37/153; H01J 37/28; H01J 2237/1516; H01J 2237/1518
See application file for complete search history.

(56) References Cited

U.S. PATENT DOCUMENTS 8,536,538 B2  9/2013  Jiang
9,035,249 B1  5/2015  Frosien et al.
(Continued)

FOREIGN PATENT DOCUMENTS

JP  2003-197141 A  7/2003
WO  2020/141031 A1  7/2020

OTHER PUBLICATIONS

Invitation to Pay Additional Fees for Application No. PCT/EP2022/052996, dated Aug. 3, 2022, 17 pages.

*Primary Examiner* — David E Smith
(74) *Attorney, Agent, or Firm* — Kilpatrick Townsend & Stockton LLP (57) ABSTRACT

A method of influencing a charged particle beam (11) propagating along an optical axis (A) is described. The method includes: guiding the charged particle beam (11) through at least one opening (102) of a multipole device (100, 200) that comprises a first multipole (110, 210) with four or more first electrodes (111, 211) and a second multipole (120, 220) with four or more second electrodes (121, 221) arranged in the same sectional plane, the first electrodes and the second electrodes being arranged alternately around the at least one opening (102); and at least one of exciting the first multipole to provide a first field distribution for influencing the charged particle beam in a first manner, and exciting the second multipole to provide a second field distribution for influencing the charged particle beam in a second manner. Further, a multipole device (100, 200) with a first multipole (110, 210) and a second multipole (120, 220) provided on the same substrate as well as a charged particle beam apparatus (500) with a multipole device (100, 200) are provided.

21 Claims, 5 Drawing Sheets

(51) Int. Cl.
*H01J 37/153* (2006.01)
*H01J 37/28* (2006.01)

(52) U.S. Cl.
CPC ............... *H01J 2237/1516* (2013.01); *H01J 2237/1518* (2013.01)

(56) References Cited

U.S. PATENT DOCUMENTS

| | | | |
|---|---|---|---|
| 9,620,328 B1* | 4/2017 | Cook | H01J 37/147 |
| 9,620,329 B1 | 4/2017 | Cook et al. | |
| 10,026,589 B1* | 7/2018 | Monahan | H01J 37/265 |
| 10,879,031 B2 | 12/2020 | Ren et al. | |
| 2007/0075258 A1* | 4/2007 | Goto | H01J 37/1477 |
| | | | 250/396 R |
| 2007/0181806 A1* | 8/2007 | Nakano | H01J 37/153 |
| | | | 250/310 |
| 2014/0034845 A1* | 2/2014 | Parker | H01J 37/317 |
| | | | 250/398 |

* cited by examiner

METHOD OF INFLUENCING A CHARGED PARTICLE BEAM, MULTIPOLE DEVICE, AND CHARGED PARTICLE BEAM APPARATUS

TECHNICAL FIELD

Embodiments described herein relate to charged particle beam apparatuses, for example, for inspection system applications, testing system applications, lithography system applications, defect review or critical dimensioning applications, and particularly to electron beam inspection apparatuses, more particularly to scanning electron microscopes. Embodiments described herein further relate to multipole devices for influencing a charged particle beam in charged particle beam apparatuses as well as to methods of influencing a charged particle beam with a multipole device. Specifically, embodiments described herein relate to multipole devices and methods for influencing an electron beam in a specific manner, e.g., by deflecting, scanning and/or correcting the electron beam, particularly in electron inspection and imaging systems.

BACKGROUND

Modern semiconductor technology has created a high demand for structuring and probing specimens in the nanometer or even in the sub-nanometer scale. Micrometer and nanometer-scale process control, inspection or structuring, is often done with charged particle beams, e.g. electron beams, which are generated, shaped, deflected and focused in charged particle beam apparatuses, such as electron microscopes or electron beam pattern generators. For inspection purposes, charged particle beams offer a superior spatial resolution compared to, e.g., photon beams.

Inspection apparatuses using charged particle beams such as scanning electron microscopes (SEM) have many functions in a plurality of industrial fields, including, but not limited to, inspection of electronic circuits during manufacturing, exposure systems for lithography, detecting systems, defect inspection tools, and testing systems for integrated circuits. In such particle beam systems, fine beam probes with a high current density can be used. For instance, in the case of an SEM, the primary electron beam generates signal particles like secondary electrons (SE) and/or backscattered electrons (BSE) that can be used to image and analyze a specimen.

Quickly inspecting and/or imaging specimens in a compact charged particle beam apparatus is, however, challenging. Specifically, various scan deflectors, alignment deflectors, lenses, beam correctors and/or other beam-optical components may be provided along the optical axis within the vacuum housing of the charged particle beam apparatus and may consume a considerable amount of space. However, space is typically limited in charged particle beam apparatuses, particularly in the area near the objective lens.

Some charged particle beam apparatuses use multipole devices, e.g. electrostatic multipoles, for beam deflection and/or beam correction. A high-order multipole, such as a 16-pole or a 32-pole can be used for various purposes, e.g. as a quadrupole or as an octupole. However, typical high-order multipoles are complex devices and it is challenging to reliably excite each of a large number of electrodes to an appropriate voltage at an appropriate time. Therefore, a high-order multipole is typically adapted for influencing a charged particle beam in a specific manner, e.g., for correcting high-order aberrations.

In view of the above, it would be beneficial to provide a compact multipole device adapted for flexibly and reliably influencing a charged particle beam. Further, it would be beneficial to provide a method of flexibly and reliably influencing a charged particle beam in a charged particle beam apparatus, even if only a restricted space is available. Finally, it would be beneficial to provide a charged particle beam apparatus suitable for influencing a charged particle beam in a desired manner within a limited space.

SUMMARY

In light of the above, a method of influencing a charged particle beam propagating along an optical axis, a multipole device for influencing a charged particle beam propagating along an optical axis, and a charged particle beam apparatus for inspecting or imaging a specimen are provided according to the independent claims.

According to a first aspect, a method of influencing a charged particle beam propagating along an optical axis is provided. The method includes guiding the charged particle beam through at least one opening of a multipole device that includes a first multipole with four or more first electrodes and a second multipole with four or more second electrodes arranged in the same sectional plane, the four or more first electrodes and the four or more second electrodes being arranged alternately around the at least one opening; and at least one of exciting the first multipole to provide a first field distribution for influencing the charged particle beam in a first manner, and exciting the second multipole to provide a second field distribution for influencing the charged particle beam in a second manner.

According to another aspect, a multipole device for influencing a charged particle beam propagating along an optical axis is provided. The multipole device includes a substrate with at least one opening for the charged particle beam, which extends along the optical axis through the substrate; a first multipole including four or more first electrodes provided on the substrate; a second multipole including four or more second electrodes provided on the substrate, the four or more first electrodes and the four or more second electrodes being arranged alternately around the at least one opening; a first power supply arrangement for connecting the first electrodes to a first voltage supply; and a second power supply arrangement for connecting the second electrodes to a second voltage supply.

The first power supply arrangement may be configured to excite the first multipole to provide a first field distribution for influencing the charged particle beam in a first manner, e.g., for deflecting the charged particle beam ("beam shift"). The second power supply arrangement may be configured to excite the second multipole to provide a second field distribution for influencing the charged particle beam in a second manner, e.g., for scanning the charged particle beam ("beam scan"), wherein the first and second field distributions may be superimposed over one another.

According to another aspect, a charged particle beam apparatus for imaging and/or inspecting a specimen with a charged particle beam, particularly with an electron beam, is provided. The charged particle beam apparatus may include a charged particle beam source for generating the charged particle beam; an objective lens for focusing the charged particle beam on the specimen; and a multipole device for influencing the charged particle beam, wherein the multipole device is configured in accordance with any of the embodiments described herein.

The charged particle beam apparatus may provide a large field of view when the multipole device is arranged in the vicinity, or inside, the objective lens, enabling large beam shifts.

The multipole device may include a first multipole for influencing the charged particle beam in a first manner, e.g., being adapted for beam deflection ("beam shift"), and a second multipole for influencing the charged particle beam in a second manner, e.g., being adapted for beam scanning ("beam scan"), particularly simultaneously with the beam shift.

Embodiments are also directed at apparatuses for carrying out the disclosed methods and include apparatus parts for performing the individual method actions. This method may be performed by way of hardware parts, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Figure 1:
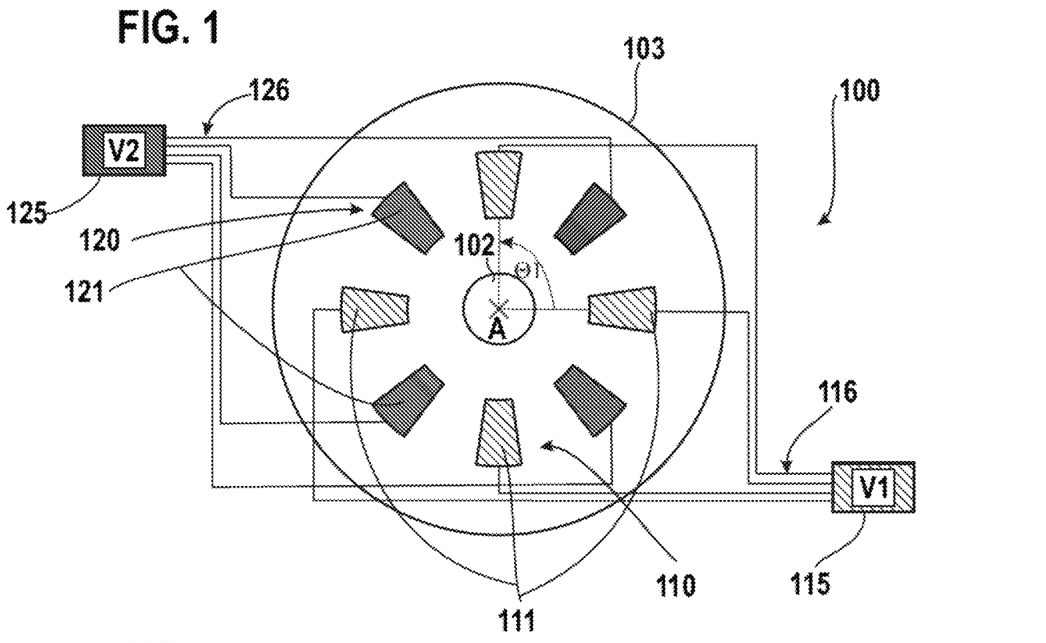
FIG. 1 shows a schematic view of a multipole device according to embodiments described herein that is adapted for being operated according to any of the methods described herein.

FIG. 1 is a schematic view of a multipole device 100 for influencing a charged particle beam propagating along an optical axis A according to embodiments described herein. The multipole device 100 includes a substrate 103 with at least one opening 102 for the charged particle beam. The at least one opening 102 extends along the optical axis A through the substrate 103.

The multipole device 100 includes a first multipole 110 with four or more first electrodes 111 provided on the substrate 103 and a second multipole 120 with four or more second electrodes 121 provided on the substrate 103. The first electrodes 111 and the second electrodes 121 may be arranged on the same main surface of the substrate 103, particularly in the same sectional plane that perpendicularly intersects the optical axis A. Accordingly, the charged particle beam propagating through the at least one opening 102 can be influenced by the first multipole 110 and by the second multipole 120 in a beam interaction space in or near the center of the at least one opening 102.

The first multipole 110 may be an electrostatic multipole or a magnetic multipole. The second multipole 120 may be an electrostatic multipole or a magnetic multipole. In some embodiments, both the first multipole 110 and the second multipole 120 are electrostatic multipoles. An electrostatic multipole is configured to influence the charged particle beam with an electric field, and the electrodes of an electrostatic multipole are typically conductors (e.g., conductive bodies or traces) that can be set on a predetermined electric potential. A magnetic multipole is configured to influence the charged particle beam with a magnetic field, and the electrodes of a magnetic multipole are typically magnets (e.g., coils) that can provide a predetermined magnetic field.

As is schematically depicted in FIG. 1, the first electrodes 111 of the first multipole 110 may be arranged at equidistant angular positions around the at least one opening 102, and the second electrodes 121 of the second multipole 120 may be arranged at equidistant angular positions around the at least one opening 102. For example, if the first multipole 110 and the second multipole 120 are quadrupoles (as in FIG. 1), the four first electrodes 111 may be arranged such that two adjacent first electrodes enclose a respective angle of 90° relative to the optical axis A (for example, the first electrodes are arranged at the positions $\Theta 1=0°, 90°, 180°, 270°$), and the four second electrodes 121 may be arranged such that two adjacent second electrodes enclose a respective angle of 90° relative to the optical axis A (for example, the second electrodes are arranged at positions $\Theta 2=45°, 135°, 225°, 315°$).

The four or more first electrodes 111 and the four or more second electrodes 121 are arranged alternately around the at least one opening 102. In the figures, the first electrodes 111 are illustrated with a first hatching and the second electrodes 121 are illustrated with a second hatching, such that the alternate arrangement of the first electrodes 111 and the second electrodes 121 around the at least one opening is clearly visible.

Accordingly, the multipole device 100 includes two distinct multipoles that are arranged in an interleaved manner on the same substrate, wherein the substrate forms a support for the electrodes. Since two distinct multipoles are arranged on the same substrate in the same sectional plane and interact with the charged particle beam in the same beam interaction area, space can be saved and a compact multipole device is provided. For example, the multipole device with at least two distinct multipoles may be placed in or near the objective lens where space is typically limited.

A "multipole" can be understood as an arrangement of electrodes (e.g., electrodes for providing electric and/or magnetic fields) configured for influencing the charged particle beam in a specific manner. The multipoles of the multipole device described herein have at least four electrodes, respectively. For example, a multipole may be a quadrupole with four electrodes, an octupole with eight electrodes, or a higher order multipole, such as a 12-pole or a 16-pole.

A quadrupole with four electrodes can naturally be used for generating a quadrupole field, e.g., for aberration correction (for example, astigmatism correction), but a quadrupole can also be used for generating a dipole field that can be applied in a selectable direction. Accordingly, a quadrupole can be used as a beam deflector for deflecting the beam in a selectable deflection direction. Similarly, an octupole can naturally be used for generating an octupole field, but an octupole can also be used for generating a quadrupole field acting in a selectable direction (e.g., for astigmatism correction), and an octupole can also be used for generating a dipole field acting in a selectable direction (e.g., for deflecting the charged particle beam in a selectable deflection direction).

According to embodiments described herein, two multipoles (which are at least quadrupoles or higher order multipoles) are provided in the same sectional plane on the same substrate, such that the charged particle beam can be influenced with one compact multipole device within a small beam interaction space in at least two different manners. For example, the first multipole may be configured for beam correction, and the second multipole may be configured for beam alignment; or the first multipole may be configured for deflecting the beam to a specific region of interest on the specimen ("beam shift"), and the second multipole may be configured for scanning the beam over the specimen in the specific region of interest ("beam scan"). Therefore, a flexible and compact multipole device is provided according to embodiments described herein.

The multipole device 100 may further include a first power supply arrangement 116 for connecting the first electrodes 111 of the first multipole 110 to a first voltage supply 115 and a second power supply arrangement 126 for connecting the second electrodes 121 of the second multipole 120 to a second voltage supply 125. Connecting each of the first and second multipoles to a respective separate voltage supply facilitates the control of the respective multipole and ensures that actually two distinct multipoles are provided. For example, it can be ensured that the first electrodes 111 of the first multipole can be excited and controlled simultaneously with a respective predetermined voltage without negatively affecting and without being negatively affected by the voltage supply of the second electrodes of the second multipole when the first and second multipoles are connected to different voltage supplies. Further, the first voltage supply 115 can be specifically adapted to the task of the first multipole (which may be, for example, a strong and slowly varying or periodically constant beam deflection beneficially conducted by a low-speed high-voltage power supply, also referred to herein as "beam shift"), and the second voltage supply 125 can be specifically adapted to the task of the second multipole (which may be, for example, a quick scanning of the charged particle beam, beneficially conducted by a high-speed low-voltage power supply, also referred to herein as "beam scan").

Accordingly, even if the multipole device 100 of FIG. 1 includes a total of eight electrodes arranged around the at least one opening 102, the multipole device 100 of FIG. 1 is substantially different from a conventional octupole with eight electrodes that are powered by one single voltage supply and can, therefore, be excited only in one manner at a time, e.g. either for deflection or for beam correction. Further, since a conventional octupole is powered by one voltage supply with eight output terminals, a voltage change of some of the output terminals would also affect the other output terminals, such that a conventional octupole does only allow the application of one common field distribution at a time provided by all the electrodes of the octupole. In contrast to a conventional octupole, the multipole device 100 of FIG. 1 includes two distinct quadrupoles that can be controlled and operated fully independently by being connected to a respective voltage supply via a respective power supply arrangement. Accordingly, each quadrupole can be tailored to a specific task, and a change of the output voltages of the output terminals of the first voltage supply does not influence the output terminals of the second voltage supply, such that the first multipole and the second multipole can be controlled independently, allowing a more accurate and more reliable beam control.

Specifically, the first multipole 110 can be excited to provide a first field distribution for influencing the charged particle beam in a first manner, and the second multipole 120 can be excited (simultaneously or subsequently, as appropriate) to provide a second field distribution for influencing the charged particle beam in a second manner.

The multipole device 100 described herein can be used for influencing the charged particle beam, particularly an electron beam, propagating along the optical axis A as follows: The charged particle beam can be guided through the at least one opening 102 of the multipole device 100, wherein the multipole device 100 includes a first multipole 110 with four or more first electrodes 111 and a second multipole 120 with four or more second electrodes 121 arranged in a sectional plane, the four or more first electrodes 111 and the four or more second electrodes 121 being arranged alternately around the at least one opening 102.

The first multipole 110 can be excited to provide a first field distribution for influencing the charged particle beam in a first manner. Simultaneously or subsequently, the second multipole 120 can be excited to provide a second field distribution for influencing the charged particle beam in a second manner.

Influencing the charged particle beam in the first manner may be selected from the group consisting of: beam deflection, beam scanning, aberration correction, stigmation, collimation, focusing, beam alignment, and blanking. Influencing the charged particle beam in the second manner may be selected from the group consisting of: beam deflection, beam scanning, aberration correction, stigmation, collimation, focusing, beam alignment, and blanking. The second manner is typically different from the first manner. For example, the first field distribution may cause a shift of the charged particle beam to a specific area of interest of the specimen in the x-y-plane (which is the plane of the specimen), and the second field distribution may cause a fast scanning of the beam over the specimen in said area of interest. In another example, the first field distribution may cause an aberration correction of the charged particle beam, e.g. an astigmatism correction, and the second field distribution may cause a fast beam scanning over the specimen or a beam alignment of the charged particle beam to propagate along a predetermined beam path. Other examples of influencing the charged particle beams in two different manners by the two multipoles are possible.

In some embodiments, which can be combined with other embodiments described herein, the first field distribution and/or the second field distribution may be selected from the group consisting of: a dipole field having a selectable azimuth angle, a quadrupole field having a selectable azimuth angle, and an octupole field. For example, the first field distribution may be a dipole field having a selectable azimuth angle, such that the charged particle beam is deflected in a specific direction defined by the selectable azimuth angle. For example, the second field distribution may be a quickly varying dipole field for providing a beam scanning over the specimen, e.g., a raster-scanning in the x-y-plane defined by the specimen.

In some embodiments, which can be combined with other embodiments described herein, the first multipole 110 and the second multipole 120 are simultaneously excited to provide the first field distribution superimposed on the second field distribution. Therefore, the charged particle beam may be influenced at the same time in two different manners by the two superimposed field distributions applied by the first and second multipoles. For example, the first field distribution may be a quadrupole field providing an astigmatism correction and the second field distribution may be a dipole field causing a beam scanning, such that the charged particle beam is simultaneously corrected and scanned by the multipole device.

In some embodiments, the first field distribution and/or the second field distribution are dipole fields. In other words, the first multipole (that includes at least four electrodes) is configured to apply a first dipole field on the charged particle beam and/or the second multipole (that includes at least four electrodes) is configured to apply a second dipole field on the charged particle beam, particularly simultaneously. The two dipole fields may have different strengths, directions and/or may vary with different speeds. The two dipole fields may be applied for different purposes, e.g., for deflecting and for directing the beam to a predetermined region of interest on the specimen ("beam shift") and for quickly scanning the charged particle beam over the specimen. Therefore, the two dipole fields may be substantially different in strengths and variation speeds, as will be explained in further detail below.

In particular, the first field distribution may be a first dipole field and the second field distribution may be a second dipole field, the first dipole field being stronger than the second dipole field. For example, at least temporarily, a ratio between a maximum field strength of the first dipole field and a maximum field strength of the second dipole field is 5:1 or more, particularly 10:1, or even 20:1 or more. The maximum field strength of a dipole field is typically located at the position of the optical axis A, typically approximately in the center of the at least one opening 102.

In some implementations, the first voltage supply 115 and the second voltage supply 125 may be different types of voltage supplies. For example, the first and second voltage supplies may be configured to provide different maximum output voltages and/or different maximum output voltage variation speeds. In particular, the second voltage supply 125 may be adapted for a quicker variation of the output voltage than the first voltage supply 115. Alternatively or additionally, the first voltage supply 115 may be adapted for higher maximum output voltages than the second voltage supply 125. For example, the first voltage supply 115 may be configured for a maximum output voltage of 100 V or more and/or a maximum voltage variation speed below 1 GHz, e.g., in the MHz-range. Alternatively or additionally, the second voltage supply 125 may be configured for a maximum output voltage of 50 V or less, particularly 20 V or less, or even 10 V or less, and/or a maximum voltage variation speed above 1 GHz. In particular, the first voltage supply 115 may be a low-speed high-voltage power supply and/or the second voltage supply 125 may be a high-speed low-voltage power supply.

In some embodiments, the first power supply arrangement 116 is configured for higher voltages than the second power supply arrangement 126. In particular, the first power supply arrangement 116 may include a high-voltage connection between each of the first electrodes 111 and the first voltage supply 115. For example, the high-voltage connections may be adapted for voltages of 100 V or more. The second power supply arrangement 126 may include a low-voltage connection between each of the second electrodes 121 and the second voltage supply 125. For example, the low-voltage connections may be adapted for voltages of 50 V or less. In some implementations, the cross-sectional area of a high-voltage connection is larger than the cross-sectional area of a low-voltage connection. Alternatively or additionally, the second power supply arrangement 126 may be configured as a high-speed connection between each of the second electrodes 121 and the second voltage supply 125. For example, the high-speed connections of the second power supply arrangement 126 may be shielded and/or may have an impedance matching, allowing voltage variation speeds in the GHz range to be reliably transmitted to the second electrodes of the second multipole.

FIG. 1 shows an embodiment of a multipole device 100 including two independent quadrupoles arranged in an interleaved way in one sectional plane. Space can be saved and the charged particle beam can be influenced synchronously or subsequently in different manners within the same beam interaction space.

Figure 2:
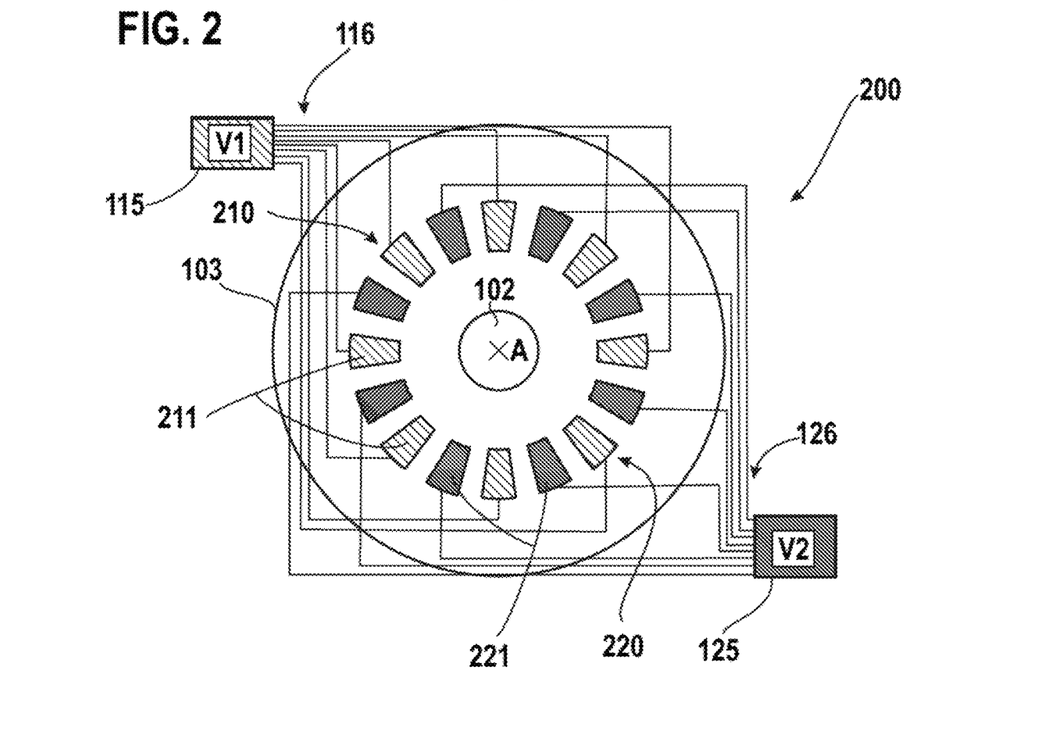
FIG. 2 shows a schematic view of a multipole device according to embodiments described herein that is adapted for being operated according to any of the methods described herein.

FIG. 2 shows another embodiment of a multipole device 200 for influencing a charged particle beam, particularly an electron beam, according to embodiments described herein. Apart from the number of electrodes of the first multipole and the second multipole, the multipole device 200 is similar to the multipole device 100 of FIG. 1, such that reference can be made to the above explanations, which are not repeated here.

The multipole device 200 includes a substrate 103 with at least one opening 102 for the charged particle beam propagating along the optical axis A. Eight first electrodes 211 of a first multipole 210 are provided on the substrate 103, and eight second electrodes 221 of a second multipole 220 are provided on the substrate 103, particularly on the same main surface of the substrate such as to surround the at least one opening 102 in an equi-angular manner. The eight first electrodes 211 and the eight second electrodes 221 are arranged alternately around the at least one opening 102.

Hence, the multipole device 200 of FIG. 2 includes two independent octupoles arranged in an interleaved way in one sectional plane. Space can be saved and the charged particle beam can be influenced synchronously or subsequently in different manners within the same beam interaction space.

According to embodiments described herein, the first multipole 210 can be excited to provide a first field distribution for influencing the charged particle beam in a first manner, and the second multipole 220 can be excited to provide a second field distribution for influencing the charged particle beam in a second manner, particularly different from the first manner. For example, the first multipole 210 may apply a first dipole field on the charged particle beam for deflecting the charged particle beam, e.g.

to a region of interest of the specimen to be inspected. The second multipole 220 may apply a second dipole field on the charged particle for scanning the charged particle beam over the specimen, particularly over the region of interest, e.g. in a raster-scanning pattern. The charged particle beam may be influenced in other manners as explained above with reference to FIG. 1. The first field distribution can be superimposed on the second field distribution by exciting the first and second multipoles simultaneously.

According to some embodiments described herein, the first multipole 210 is a first octupole with eight first electrodes 211, and the second multipole 220 is a second octupole with eight second electrodes 221, the first octupole and the second octupole being independent octupoles that are independently controllable and operable. Accordingly, the multipole device 200 includes a total of 16 poles arranged around the at least one opening 102, eight first poles belonging to the first octupole and eight second poles belonging to the second octupole, wherein the eight poles of the first octupole and the eight poles of the second octupole are arranged alternately around the at least one opening 102.

In some embodiments, the first multipole 210 and the second multipole 220 are electrostatic multipoles, and the first electrodes 211 and the second electrodes 221 are conductive portions provided on the substrate and configured to be set on a predetermined potential, respectively. A "substrate" may be understood as a supporting body for supporting the electrodes of the first and second multipoles thereon, e.g. a thin plate. The substrate is not necessarily round (as depicted in the figures), but may also have a different shape. The substrate may include an insulator surface on which the electrodes are arranged.

The first multipole 210 may be configured to provide a first dipole field for deflecting the charged particle beam, particularly for directing the beam to a predetermined region of interest of the specimen over a predetermined time period ("beam shift"), and the second multipole 220 may be configured to provide a second dipole field superimposed on the first dipole field for scanning the charged particle beam over the specimen.

The multipole device 200 described herein allows for a large beam deflection in a predetermined selectable deflection direction by the first multipole superimposed by a fast scanning of the charged particle beam in a predetermined scanning pattern, particularly a slow deflection and a fast scanning of the charged particle beam at the same time. Typically, the deflection is relatively slow but uses a comparatively high deflection voltage for deflecting the charged particle beam to the predetermined region of interest on the specimen. Typically, the scan voltage varies comparatively fast, but with a relatively low maximum deflection voltage, e.g. quickly varying in steps or continuously between −10V and +10V. Accordingly, it is beneficial to use two separately controllable octupoles, each octupole being powered by a respective power supply arrangement and a respective voltage supply, such that each octupole is tailored to the task to be performed. Two independently operating and controllable octupoles with electrodes provided in the same sectional plane are provided according to embodiments described herein.

A first power supply arrangement 116 may be provided for connecting the first electrodes 211 with a first voltage supply 115, and a second power supply arrangement 126 may be provided for connecting the second electrodes 221 to a second voltage supply 125. Therefore, two independently controllable octupoles are provided in an interleaved way in one sectional plane.

The first multipole and the second multipole can be simultaneously excited to provide the first field distribution and the second field distribution for influencing the charged particle beam synchronously in the first and second manners.

Specifically, at least one or both of the first field distribution and the second field distribution may be a dipole field. The first field distribution may be a slowly varying or periodically constant dipole field and the second field distribution may be a quickly varying dipole field for scanning.

In some implementations, the first field distribution is a first dipole field and the second field distribution is a second dipole field, the first dipole field being stronger than the second dipole field, at least temporarily, e.g., by a factor of 5 or more, or 10 or more.

The first field distribution may be a dipole field that deflects the charged particle beam to a predetermined region of interest of the specimen that is to be inspected, and the second field distribution may be a dipole field that scans the charged particle beam over the specimen, particularly in the region of interest.

In some embodiments, the first field distribution is maintained for a predetermined time (for example, for 1 second or longer) for deflecting the charged particle beam to the predetermined region of interest of the specimen while the second field distribution is varied for scanning the charged particle beam over said predetermined region of interest.

After the region of interest has been scanned by varying the second field distribution, e.g. in a raster-scanning manner, the first field distribution may be changed for deflecting the charged particle beam to a predetermined second region of interest of the specimen that is to be inspected. The changed first field distribution may be maintained for a predetermined time (for example, 1 second or longer) while the second field distribution is varied for scanning the charged particle beam over said predetermined second region of interest.

The specimen inspection process may proceed accordingly by directing the charged particle beam subsequently to different regions of interest by changing the first field distribution provided by the first multipole. The first field distribution may be maintained for each region of interest for a predetermined time, such that the respective region of interest can be inspected by quickly varying the second field distribution for scanning the charged particle beam over the specimen in the respective region of interest. This allows a large specimen surface to be inspected by varying the dipole fields provided by the first and second multipoles accordingly.

A reliable beam deflection superimposed by a quick beam scanning can be provided by connecting the first multipole to a first voltage supply adapted for a comparatively slow but large beam deflection and by connecting the second multipole to a second voltage supply adapted for a quick voltage variation for beam scanning with a comparatively lower maximum voltage.

Figure 3A:
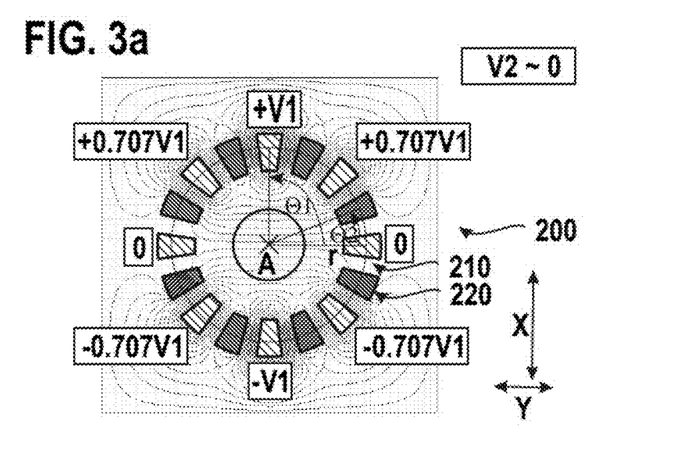
FIGS. 3a-c illustrate the multipole device of FIG. 2 in a first operation mode in which the first multipole generates a dipole field.
Figure 3B:
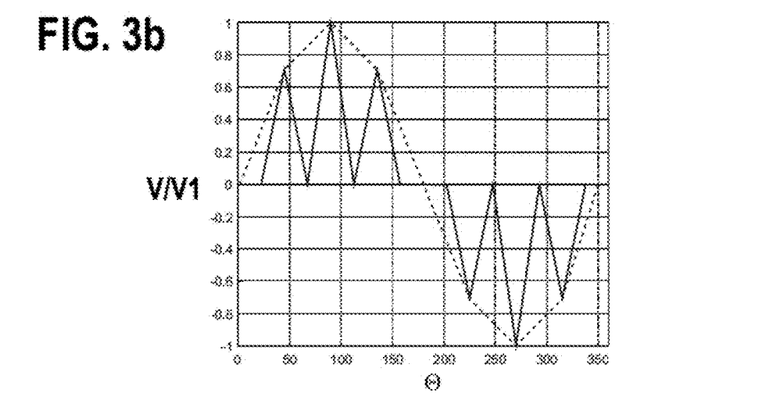
Figure 3C:
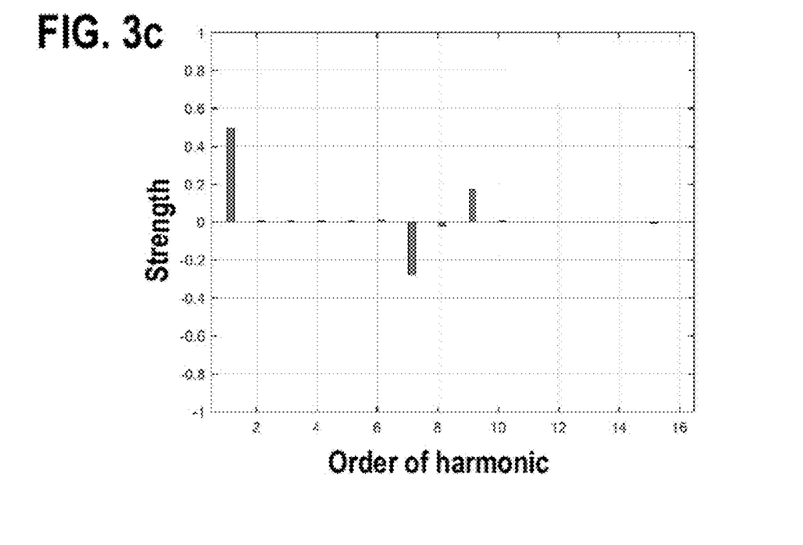

FIGS. 3a-c illustrate the multipole device 200 of FIG. 2 in a first operation mode where a first field distribution, namely a first dipole field, is provided by the first electrodes of the first multipole 210, while a small or zero voltage V2~0 is applied to the second electrodes of the second multipole 220. A dipole field can be provided by applying voltages of $V1*\sin(\theta 1)$ to the first electrodes of the first multipole, wherein $\theta 1$ refers to the angular position of the respective first electrode (the position of $\theta 1=0$ can be chosen arbitrarily for applying the dipole field in a selectable direction), and V1 is a maximum voltage provided by the first voltage supply 115 at a specific time. As is schematically illustrated in FIG. 3a, the following voltages V are applied to the eight first electrodes of the first multipole 210 for providing the dipole field:

$V1*\sin 0°=0$ $V1*\sin 45°=+0.707*V1$ $V1*\sin 90°=+V1$ $V1*\sin 135°=+0.707*V1$ $V1*\sin 180°=0$ $V1*\sin 225°=-0.707*V1$ $V1*\sin 270°=-V1$ $V1*\sin 315°=-0.707*V1$.

At the same time, voltages that are small compared to the voltage V1 (e.g. zero voltages, V2=0, as depicted in FIG. 3a) are applied to the eight second electrodes of the second multipole 220, and the resulting field distribution is depicted in FIG. 3a via the electric field lines. As is shown in FIG. 3a, an electric dipole field is produced in a central region of the multipole device 200 where the optical axis A extends through the multipole device, such that a dipole field is exerted on the charged particle beam propagating along the optical axis A, causing a beam shift in the x-y-plane. Instead of V2=0 as depicted in FIG. 3a, it is possible to apply small variable voltages $V2*\sin(\theta 2)$, particularly with V2<V1, to the second electrodes for causing a beam scanning.

By adjusting the maximum voltage V1 that is provided by the first voltage supply, the deflection strength caused by the first multipole 210 can be set as appropriate. Further, the deflection direction can be set as appropriate in the x-y-plane if θ2 is replaced by θ2+ε, ε being a phase term. The field distribution that is exemplarily shown in FIG. 3a causes a beam deflection in the x-direction.

Figure 3D:
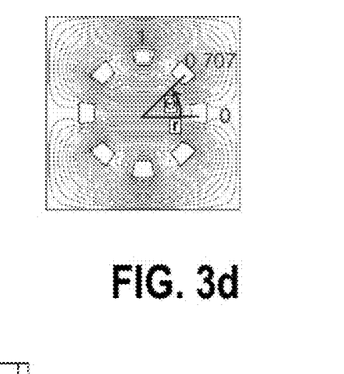
FIG. 3d illustrates a dipole field generated by a conventional octupole.

Notably, the dipole field produced by the first multipole 210 of the multipole device 200 is different from a dipole field produced by a conventional octupole (schematically depicted in FIG. 3d) because a second electrode of the second multipole 220 provided on a relatively small or zero potential (V2~0 V in FIG. 3a) is arranged between two adjacent first electrodes of the first multipole 210, respectively. Therefore, the electric potential on a ring line with radius r (r=electrode radius) extending around the optical axis A repeatedly varies between $V=V1*\sin(\theta 1)$ and zero at the positions of the first and second electrodes, as it is schematically depicted by the continuous line in FIG. 3b. Notably, the electrodes are modeled here to be infinitely small (i.e., point electrodes), and a linear voltage change is assumed between two adjacent point electrodes, respectively, in order to simplify the calculations.

In contrast thereto, a conventional octupole produces an essentially sine-shape electrical potential in dependence on the angle θ on a ring line having the radius r around the optical axis A, as is schematically depicted by the dashed line in FIG. 3b.

Once the voltages on a ring line with radius r (r=electrode radius) are known, the multipole components of the resulting total field distribution at the position of the optical axis A can be calculated with a Fourier analysis. FIG. 3c shows the strength of the harmonics of the field distribution of FIG. 3a. As can be seen in FIG. 3c, the coefficient of the fundamental dipole is about 0.5 and all harmonics below order 7 are zero, but a clearly visible 7th harmonic with a coefficient of about −0.3 and a clearly visible 9th harmonic with a coefficient smaller than 0.2 are generated. Since the field of the 7th harmonic scales with $R^{-6}$ (R being the distance of an electron from the optical axis A), the effect of the $7^{th}$ harmonic is extremely small and essentially negligible. Also the $9^{th}$ harmonic will have a very small effect. Accordingly, a generally good dipole field can be produced with the first multipole 210 of the multipole device 200 according to embodiments described herein, even if a comparatively small or zero voltage is simultaneously applied to the second electrodes of the second multipole 220.

In some embodiments, a second dipole field is generated by the second multipole 220 while the first dipole field is generated by the first multipole. Specifically, voltages of $V2*\sin(\theta 2)$ are applied to the second electrodes of the second multipole, θ2 referring to the angular position the respective second electrode (the position of θ2=0 can be chosen arbitrarily or varied for applying the dipole field in a selectable direction), and V2 being a maximum voltage provided by the second voltage supply at a time. The value V2 may quickly vary (e.g., from −V2 to +V2) for scanning the charged particle beam along a line over the specimen. Additionally, the values of $V2*\sin(\theta 2)$ may quickly vary for raster-scanning the charged particle beam in the x-y-plane over a region of interest to be inspected.

In typical embodiments, the maximum voltage V1 provided by the first voltage supply (causing a slowly varying or periodically constant beam shift) is substantially larger than the maximum voltage V2 provided by the second voltage supply (causing a quick beam scanning), e.g., by a factor of 5 or more, or 10 or more. For example, the first voltage supply is configured for providing a maximum voltage of 100 V or more, allowing a beam shift by a large angle, while the second voltage supply may be configured for providing a maximum voltage V2 of 20 V or less, or 10 V or less, allowing a beam scanning over a predetermined (small) region of interest of the specimen, e.g. in order to inspect a region of interest of the specimen for finding a defect in the region of interest.

Figure 4:
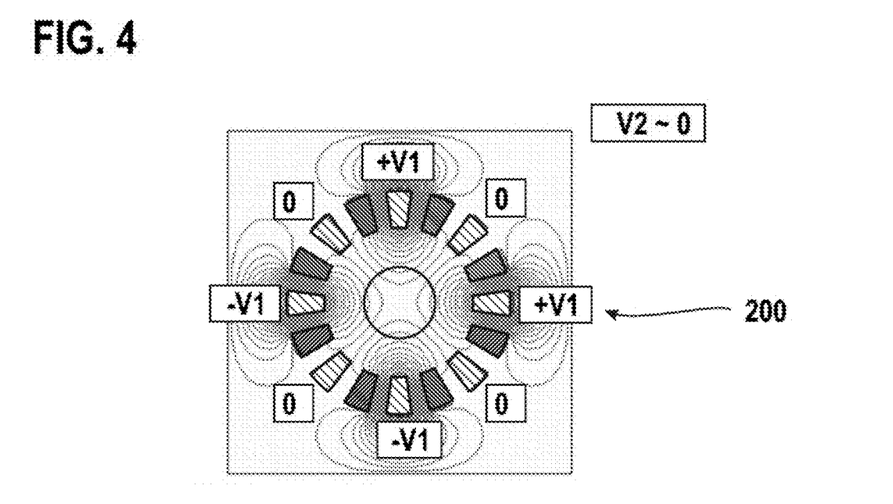
FIG. 4 illustrates the multipole device of FIG. 2 in a second operation mode in which the first multipole generates a quadrupole field.

FIG. 4 illustrates the multipole device 200 of FIG. 2 in a second operation mode where a first field distribution, namely a quadrupole field, is provided by the first electrodes of the first multipole, while a small or zero voltage V2~0 is applied to the second electrodes of the second multipole. A quadrupole field can be provided by applying voltages of +V1, 0, +V1, 0, −V1, 0, −V1, 0 to the first electrodes in this order in the circumferential direction. A quadrupole field can, for example, be used for astigmatism correction.

Simulations have shown that the quadrupole field produced by the first multipole at the position of the optical axis A is reasonably good, even if small (V2<V1) or essentially zero voltages (V2~0) are simultaneously applied to the second electrodes of the second multipole, e.g. for scanning the charged particle beam or for providing high-order corrections.

Accordingly, it has been shown that it is possible to influence the charged particle beam simultaneously in two manners by two multipoles (e.g., quadrupoles or octupoles) that are provided in one sectional plane in an interleaved way, which has not been considered or demonstrated before. Space can be saved and a compact and flexibly usable multipole device is provided according to embodiments described herein.

It is to be understood that the multipole device described herein can include more than two multipoles on the same substrate, e.g. three independently operable quadrupoles, 6-poles, or octupoles in the same sectional plane. An "alternate" arrangement of first and second electrodes as used herein is meant to encompass an alternate arrangement of first, second, and third (or further) electrodes in the circumferential direction around the optical axis. Further, the multipoles may be quadrupoles or higher-order multipoles, particularly octupoles, but also 12-poles or 16-poles. It is further possible that the multipole device is configured for a multi-beamlet apparatus. In the latter case, the substrate includes more than one opening, and first and second electrodes of two independently operable multipoles are alternately arranged around each of the more than one opening.

Figure 5:
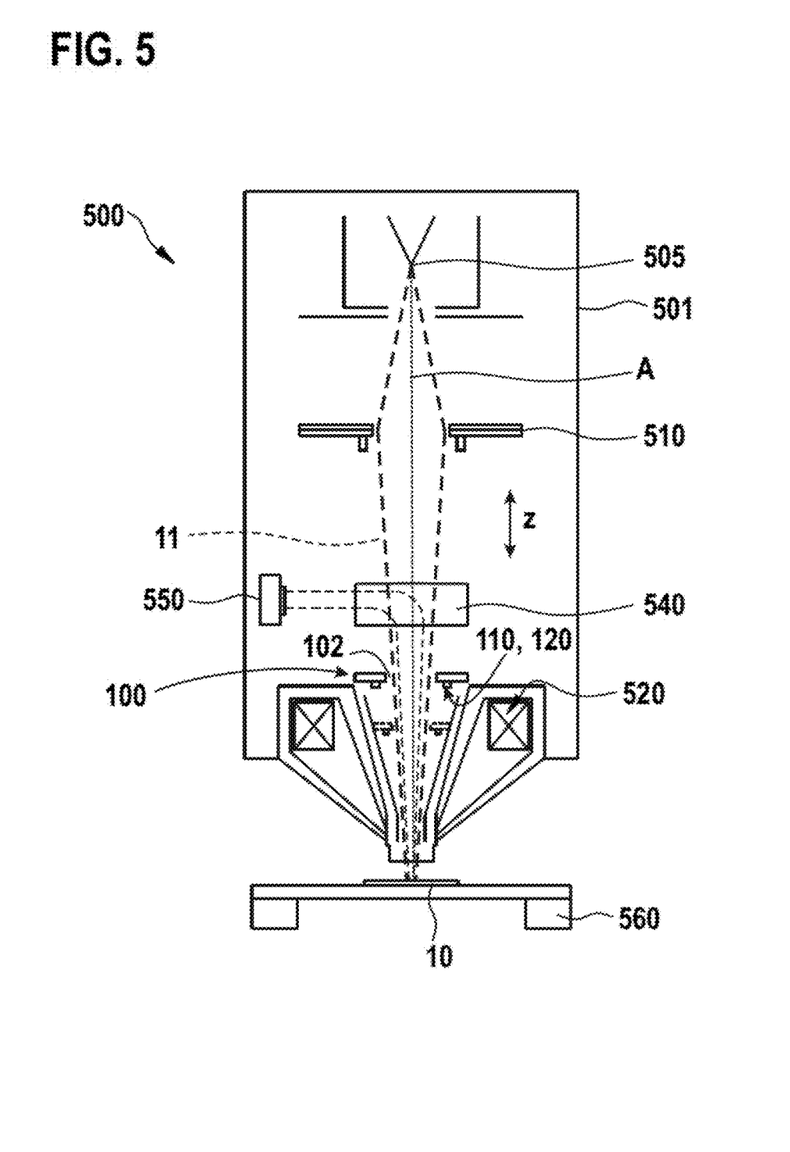
FIG. 5 is a schematic view of a charged particle beam apparatus according to embodiments described herein.

According to further aspect described herein, a charged particle beam apparatus 500 for inspecting and/or imaging a specimen 10 is provided. FIG. 5 shows a schematic view of a charged particle beam apparatus 500 for inspecting a specimen 10, e.g., with an electron beam.

The charged particle beam apparatus 500 may be an electron inspection apparatus, e.g., a scanning electron microscope (SEM), configured for inspecting and/or imaging a specimen 10 placed on a specimen stage 560.

The charged particle beam apparatus 500 includes a charged particle beam source 505 for generating the charged particle beam 11 propagating along an optical axis A. The charged particle beam source 505 may be an electron source, e.g., a cold field emitter (CFE), a thermal field emitter (TFE) or another type of electron source.

The charged particle beam apparatus 500 includes an objective lens 520 configured to focus the charged particle beam 11 on the specimen 10. The objective lens 520 may be a magnetic objective lens, an electrostatic objective lens, or a combined magnetic-electrostatic objective lens.

The specimen 10, e.g. a wafer, an electronic circuit, or another substrate to be inspected, may be placed on the specimen stage 560. The specimen stage 560 may be movable in the plane of the specimen, i.e. in the x-y-plane, and/or in the direction z of the optical axis A.

The charged particle beam apparatus 500 may include a vacuum housing 501 in which the beam-optical components of the charged particle beam apparatus 500 are arranged. The vacuum housing 501 can be evacuated to a sub-atmospheric pressure below 1 mbar, e.g. $10^{-5}$ mbar or less.

The charged particle beam apparatus 500 may include further beam-optical components, such as a condenser lens 510 for collimating the charged particle beam 11, an aberration corrector for correcting beam aberrations, a beam separator 540 for separating signal particles (e.g., secondary electrons SEs and/or backscattered electrons BSEs) generated upon impingement of the charged particle beam 11 on the specimen 10 from the charged particle beam 11, and/or a detector 550 for detecting the signal particles.

The charged particle beam apparatus 500 further includes a multipole device 100 (or 200) according to any of the embodiments described herein. The multipole device 100 may be arranged such that the optical axis A extends through the at least one opening 102 of the multipole device.

In some embodiments, which can be combined with other embodiments described herein, the multipole device 100 is arranged adjacent to or within the objective lens 520. Arranging the multipole device 100 close to, or even in the objective lens 520 is beneficial because larger deflection angles are possible if the multipole device 100 is arranged close to the specimen 10. A charged particle beam apparatus with a large field of view (FOV) can be provided. FIG. 5 shows the multipole device 100 at a position upstream of the objective lens at a distance of 2 cm or less from the objective lens. Further, an alternative position of the multipole device 100 in the objective lens 520 is illustrated in dashed lines in FIG. 5. Generally, a distance between the multipole device 100 and the objective lens 520 along the optical axis A may be 5 cm or less, such that an electron beam inspection apparatus with a large FOV can be provided.

In some embodiments, which can be combined with other embodiments described herein, the multipole device 100 is configured for deflecting the charged particle beam to a region of interest of the specimen by applying a first dipole field to the first electrodes of the first multipole 110. Further, the multipole device 100 is configured to scan the charged particle beam over the specimen in the region of interest by applying a second dipole field to the second electrodes of the second multipole 120, such that the first and second dipole fields are superimposed over one another.

The first dipole field is generally larger than the second dipole field (e.g., by a factor of 5 or more, or 10 or more), and the second dipole field typically varies more quickly than the first dipole field, providing a fast scanning movement of the charged particle beam 11 over the specimen (for example, with a variation speed of 1 GHz or more).

The first multipole 110 may deflect the charged particle beam to different regions of interest of the specimen and maintain the respective first dipole field for a predetermined time period for each region of interest to be inspected. The second multipole 120 may quickly scan the charged particle beam over each region of interest, e.g. in a raster-scanning pattern, such that each region of interest can be inspected in detail.

Figure 6:
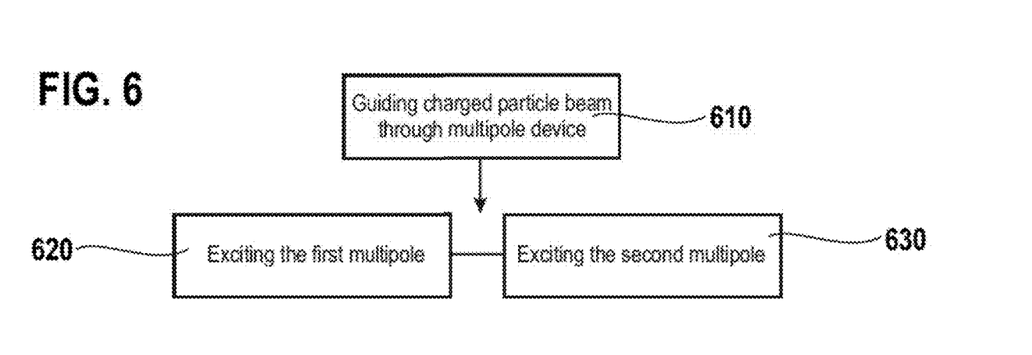
FIG. 6 is a flow diagram that illustrates a method of influencing a charged particle beam according to embodiments described herein.

FIG. 6 is a flow diagram for illustrating a method of influencing a charged particle beam according to embodiments described herein.

In box 610, a charged particle beam is guided through at least one opening of a multipole device that includes a first multipole with four or more first electrodes and a second multipole with four or more second electrodes arranged in the same sectional plane, the four or more first electrodes and the four or more second electrodes being arranged alternately around the at least one opening.

In box 620, the first multipole is excited to provide a first field distribution for influencing the charged particle beam in a first manner. For example, the first field distribution may be a first dipole field, and the first manner may be a beam deflection of the charged particle beam to a predetermined region of interest of the specimen. Alternatively, the first field distribution may be a quadrupole field, and the first manner may be an astigmatism correction or another aberration correction.

In box 630, the second multipole is excited to provide a second field distribution for influencing the charged particle beam in a second manner. For example, the second field distribution may be a second dipole field that may quickly vary for scanning the charged particle beam over the specimen in the region of interest.

The excitations of the first and second multipoles in boxes 620 and 630 may happen simultaneously, such that the charged particle beam is simultaneously influenced in two different manners by one multipole device. Specifically, a "slow" beam deflection may be superimposed on a "quick" beam scanning by two independently controlled multipoles arranged in the same sectional plane on the same substrate.

Figure 7:
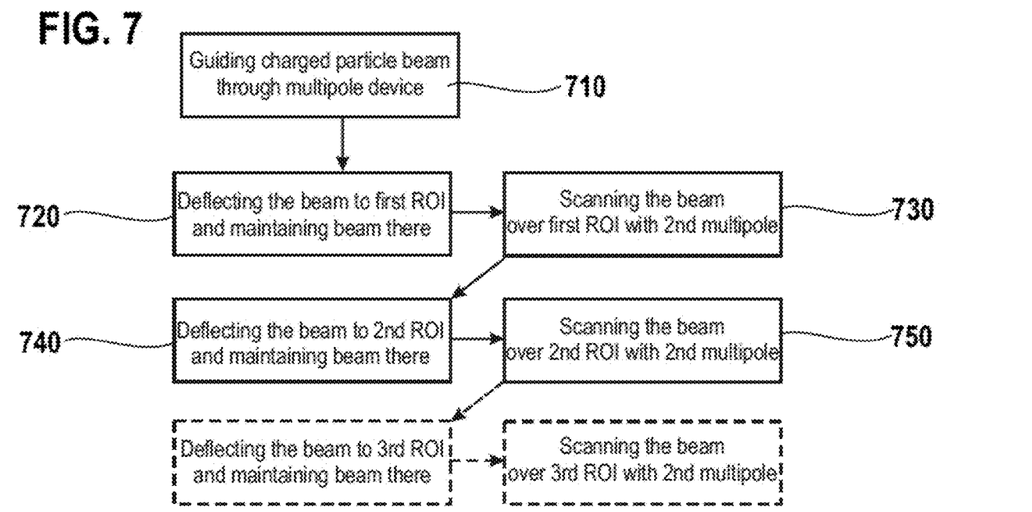
FIG. 7 is a flow diagram that illustrates a method of influencing a charged particle beam according to embodiments described herein.

FIG. 7 is a flow diagram for illustrating a method of influencing a charged particle beam according to embodiments described herein.

In box 710, a charged particle beam is guided through at least one opening of a multipole device that includes a first multipole with four or more first electrodes and a second multipole with four or more second electrodes arranged in the same sectional plane, the four or more first electrodes and the four or more second electrodes being arranged alternately around the at least one opening.

In box 720, the charged particle beam is deflected to a first region of interest (ROI) of the specimen by applying a first dipole field to the first multipole. The first dipole field is maintained during box 730, e.g. over a time period of 1 second or longer.

In box 730, the charged particle beam is scanned over the first region of interest, e.g. in a raster-scanning pattern, by applying a quickly varying scanning field to the second multipole. The first region of interest is inspected and, for example, defects of the specimen in the first region of interest can be found.

In box 740, the charged particle beam is deflected to a second region of interest (ROI) of the specimen by applying another dipole field to the first multipole. The other dipole field is maintained during box 750, e.g. over a time period of 1 second or longer.

In box 750, the charged particle beam is scanned over the second region of interest, e.g. in a raster-scanning pattern, by applying the quickly varying scanning field to the second multipole. The second region of interest is inspected and, for example, defects of the specimen in the second region of interest can be found.

The method may continue accordingly by inspecting further regions of interest of the specimen.

Specifically, the following embodiments are described herein:

Embodiment 1: A method of influencing a charged particle beam propagating along an optical axis, comprising: guiding the charged particle beam through at least one opening of a multipole device that comprises a first multipole with four or more first electrodes and a second multipole with four or more second electrodes arranged in the same sectional plane, the four or more first electrodes and the four or more second electrodes being arranged alternately around the at least one opening; and at least one or both of exciting the first multipole to provide a first field distribution for influencing the charged particle beam in a first manner, and exciting the second multipole to provide a second field distribution for influencing the charged particle beam in a second manner.

Embodiment 2: The method according to embodiment 1, wherein the first multipole is a first octupole including eight first electrodes, and/or the second multipole is a second octupole including eight second electrodes. Particularly, the first and the second multipoles are octupoles. Alternatively, the first and the second multipoles may be quadrupoles. Alternatively, the first and the second multipoles may be 16-poles.

Embodiment 3: The method according to embodiment 1 or 2, wherein the influencing of the charged particle beam in the first manner and the influencing of the charged particle beam in the second manner are selected from the group consisting of: beam deflection, beam scanning, aberration correction, stigmation, collimation, focusing, beam alignment, and blanking. In particular, the influencing of the charged particle beam in the first manner may comprise a beam deflection and the influencing of the charged particle beam in the second manner may comprise a beam scanning. Alternatively, beam deflection may be combined with aberration correction, e.g., stigmation.

Embodiment 4: The method according to any of embodiments 1 to 3, wherein the first field distribution and the second field distribution are selected from the group consisting of: a dipole field having a selectable azimuth angle, a quadrupole field having a selectable azimuth angle, and an octupole field.

Embodiment 5: The method according to any of embodiments 1 to 4, wherein the first multipole and the second multipole are simultaneously excited to provide the first field distribution superimposed on the second field distribution.

Embodiment 6: The method according to any of embodiments 1 to 5, wherein at least one or both of the first field distribution and the second field distribution is a dipole field. In particular, both the first field distribution and the second field distribution may be dipole fields.

Embodiment 7: The method according to any of embodiments 1 to 6, wherein the first field distribution is a first dipole field and the second field distribution is a second dipole field, the first dipole field being stronger than the second dipole field. In particular, a ratio between a maximum field strength of the first dipole field and a maximum field strength of the second dipole field is 5:1 or more, particular 10:1.

Embodiment 8: The method according to any of embodiments 1 to 7, wherein voltages of $V1*\sin(\theta1)$ are applied to the first electrodes of the first multipole, $\theta1$ referring to an angular position of the respective first electrode in a circumferential direction, and V1 being an adjustable deflection voltage. Alternatively or additionally, voltages of $V2*\sin(\theta2)$ are applied to the second electrodes of the second multipole, $\theta2$ referring to an angular position of the respective second electrode in the circumferential direction, and V2 being a varying scan voltage of 20 V or less.

Embodiment 9: The method according to any of embodiments 1 to 8, wherein the first field distribution is a dipole field that deflects the charged particle beam and the second field distribution is a dipole field that scans the charged particle beam over a specimen. Beam deflection and scanning may be conducted simultaneously by exciting both the first and the second multipole.

Embodiment 10: The method according to embodiment 9, wherein the first field distribution is maintained for a predetermined time for deflecting the charged particle beam to a first region of interest of the specimen while the second field distribution is varied for scanning the charged particle beam over the first region of interest.

Embodiment 11: The method according to embodiment 10, further comprising changing the first field distribution for deflecting the charged particle beam to a second region of interest of the specimen, followed by maintaining the first field distribution for a predetermined time while the second field distribution is varied for scanning the charged particle beam over the second region of interest.

Embodiment 12: The method according to any of embodiments 1 to 11, wherein the first electrodes of the first multipole are connected to a first voltage supply, particularly to a low-speed high-voltage supply, and the second electrodes of the second multipole are connected to a second voltage supply, particularly to a high-speed low-voltage power supply.

The methods according to the above embodiments may be conducted by any of the multipole devices and/or charged particle beam apparatuses described herein.

Embodiment 13: A multipole device for influencing a charged particle beam propagating along an optical axis, comprising: a substrate with at least one opening for the charged particle beam, which extends along the optical axis through the substrate; a first multipole including four or more first electrodes provided on the substrate; a second multipole including four or more second electrodes provided on the substrate, the four or more first electrodes and the four or more second electrodes being arranged alternately around the at least one opening; a first power supply arrangement for connecting the first electrodes with a first voltage supply; and a second power supply arrangement for connecting the second electrodes with a second voltage supply.

The multipole device may be configured to be operated according to any of the methods described herein.

Embodiment 14: The multipole device according to embodiment 13, wherein the first multipole is a first octupole including eight first electrodes, and/or the second multipole is a second octupole including eight second electrodes.

Embodiment 15: The multipole device according to embodiment 13 or 14, wherein the first multipole and the second multipole are electrostatic multipoles, and the first electrodes and the second electrodes are conductive portions provided on the substrate and configured to be set on a predetermined potential.

Embodiment 16: The multipole device according to any of embodiments 13 to 15, wherein the first voltage supply is a low-speed high-voltage supply, particularly configured for a maximum voltage of 100V or more and a variation speed below 1 GHz, and wherein the second voltage supply is a high-speed low-voltage power supply, particularly configured for a maximum voltage of 50V or less and a variation speed above 1 GHz.

Embodiment 17: The multipole device according to any of embodiments 13 to 16, wherein the first power supply arrangement comprises a high-voltage connection between each of the first electrodes and the first voltage supply, and wherein the second power supply arrangement comprises a high-speed connection between each of the second electrodes and the second voltage supply.

Embodiment 18: The multipole device according to any of embodiments 13 to 16, wherein the first multipole is configured to provide a first dipole field for beam deflection and the second multipole is configured to provide a second dipole field for scanning the charged particle beam over a specimen superimposed on the first dipole field.

Embodiment 19: The multipole device according to any of embodiments 13 to 18, wherein the first multipole and the second multipole are independently controllable multipoles.

Embodiment 20: A charged particle beam apparatus for inspecting or imaging a specimen with a charged particle beam, comprising: a charged particle beam source for generating the charged particle beam; an objective lens for focusing the charged particle beam on the specimen; and the multipole device for influencing the charged particle beam according to any of the embodiments described herein.

Embodiment 21: The charged particle beam apparatus according to embodiment 20, wherein the multipole device is arranged adjacent to or within the objective lens.

Embodiment 22: The charged particle beam apparatus according to embodiment 20 or 21, wherein the multipole device is configured for deflecting the charged particle beam to a region of interest of the specimen while scanning the charged particle beam over the region of interest.

While the foregoing is directed to embodiments, other and further embodiments may be devised without departing from the basic scope thereof, and the scope thereof is determined by the claims that follow.

The invention claimed is:

1. A method of influencing a charged particle beam propagating along an optical axis, comprising:
  guiding the charged particle beam through at least one opening of a multipole device that comprises a first multipole with four or more first electrodes and a second multipole with four or more second electrodes arranged in the same sectional plane, the four or more first electrodes and the four or more second electrodes being arranged alternately around the at least one opening; and at least one of:
    exciting the first multipole to provide a first field distribution for influencing the charged particle beam in a first manner, and
    exciting the second multipole to provide a second field distribution for influencing the charged particle beam in a second manner,
  wherein the first electrodes of the first multipole are connected to a first voltage supply and the second electrodes of the second multipole are connected to a second voltage supply, the first and second voltage supplies configured to provide at least one of different maximum output voltages and different maximum voltage variation speeds.

2. The method according to claim 1, wherein the first multipole is a first octupole including eight first electrodes, and the second multipole is a second octupole including eight second electrodes.

3. The method according to claim 1, wherein the influencing of the charged particle beam in the first manner and the influencing of the charged particle beam in the second manner are selected from the group consisting of: beam deflection, beam scanning, aberration correction, stigmation, collimation, focusing, beam alignment, and blanking.

4. The method according to claim 1, wherein the first field distribution and the second field distribution are selected from the group consisting of: a dipole field having a selectable azimuth angle, a quadrupole field having a selectable azimuth angle, and an octupole field.

5. The method according to claim 1, wherein the first multipole and the second multipole are simultaneously excited to provide the first field distribution superimposed on the second field distribution for synchronously influencing the charged particle beam in the first and second manners.

6. The method according to claim 1, wherein at least one or both of the first field distribution and the second field distribution is a dipole field.

7. The method according to claim 6, wherein the first field distribution is a first dipole field and the second field distribution is a second dipole field, the first dipole field being stronger than the second dipole field, particularly wherein a ratio between a maximum field strength of the first dipole field and a maximum field strength of the second dipole field is, at least temporarily, 5:1 or more.

8. The method according to claim 6,
  wherein voltages of $V1*\sin(\theta1)$ are applied to the first electrodes of the first multipole, $\theta1$ being an angular position of the respective first electrode in a circumferential direction, and V1 being an adjustable deflection voltage, and
  wherein voltages of $V2*\sin(\theta2)$ are applied to the second electrodes of the second multipole, $\theta2$ being an angular position of the respective second electrode in the circumferential direction, and V2 being a varying scan voltage of 20 V or less.

9. The method according to claim 6, wherein the first field distribution is a dipole field that deflects the charged particle beam, and the second field distribution is a dipole field that scans the charged particle beam over a specimen.

10. The method according to claim 9, wherein the first field distribution is maintained for a predetermined time for deflecting the charged particle beam to a predetermined first region of interest of the specimen while the second field distribution is varied for scanning the charged particle beam over the predetermined first region of interest.

11. The method according to claim 10, further comprising changing the first field distribution for deflecting the charged particle beam to a second region of interest of the specimen, followed by maintaining the first field distribution for a predetermined time while the second field distribution is varied for scanning the charged particle beam over the second region of interest.

12. The method according to claim 1, wherein the first voltage supply is a high-voltage power supply configured at least for voltages between 0V and 100V or more, and the second voltage supply is a high-speed power supply configured for a variation speed above 1 GHz.

13. A multipole device for influencing a charged particle beam propagating along an optical axis, comprising:
- a substrate with at least one opening for the charged particle beam, which extends along the optical axis through the substrate;
- a first multipole including four or more first electrodes provided on the substrate;
- a second multipole including four or more second electrodes provided on the substrate, the four or more first electrodes and the four or more second electrodes being arranged alternately around the at least one opening;
- a first power supply arrangement for connecting the first electrodes to a first voltage supply; and
- a second power supply arrangement for connecting the second electrodes to a second voltage supply, wherein the first and second voltage supplies are configured to provide at least one of different maximum output voltages and different maximum voltage variation speeds.

14. The multipole device according to claim 13, wherein the first multipole is a first octupole including eight first electrodes, and the second multipole is a second octupole including eight second electrodes.

15. The multipole device according to claim 13, wherein the first multipole and the second multipole are electrostatic multipoles, and the first electrodes and the second electrodes are conductive portions provided on the substrate configured to be set on a predetermined potential.

16. The multipole device according to claim 13, wherein the first voltage supply is a low-speed high-voltage power supply, particularly configured for a maximum voltage of 100V or more and a variation speed below 1 GHz, and wherein the second voltage supply is a high-speed low-voltage power supply, particularly configured for a maximum voltage of 50V or less and a variation speed above 1 GHz.

17. The multipole device according to claim 13, wherein the first multipole is configured to provide a first dipole field for beam deflection and the second multipole is configured to provide a second dipole field for scanning the charged particle beam over a specimen superimposed on the first dipole field.

18. The multipole device according to claim 13, wherein the first multipole and the second multipole are independently controllable multipoles.

19. A charged particle beam apparatus for inspecting or imaging a specimen with a charged particle beam, comprising:
- a charged particle beam source for generating the charged particle beam;
- an objective lens for focusing the charged particle beam on the specimen; and
- the multipole device for influencing the charged particle beam according to claim 13.

20. The charged particle beam apparatus according to claim 19, wherein the multipole device is arranged adjacent to or within the objective lens.

21. The charged particle beam apparatus according to claim 19, wherein the multipole device is configured for deflecting the charged particle beam to a region of interest of the specimen while scanning the charged particle beam over the region of interest.

* * * * *